(12) United States Patent
Ku

(10) Patent No.: US 8,237,486 B2
(45) Date of Patent: Aug. 7, 2012

(54) CLOCK CONTROL CIRCUIT AND SEMICONDUCTOR MEMORY APPARATUS USING THE SAME

(75) Inventor: Kie Bong Ku, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 5 days.

(21) Appl. No.: 12/965,372

(22) Filed: Dec. 10, 2010

(65) Prior Publication Data
US 2012/0119809 A1  May 17, 2012

(30) Foreign Application Priority Data
Nov. 17, 2010  (KR) .................. 10-2010-0114410

(51) Int. Cl.
*H03K 3/00* (2006.01)
(52) U.S. Cl. ............... 327/299; 327/298; 365/233.1; 365/133.12
(58) Field of Classification Search .......... 327/296–299; 365/233.1, 233.11, 233.12
See application file for complete search history.

(56) References Cited

U.S. PATENT DOCUMENTS 7,142,008 B1 * 11/2006 Sanders .................... 326/38
7,457,192 B2 * 11/2008 Kyung ................. 365/233.12

FOREIGN PATENT DOCUMENTS

| JP | 2010-182350 | 8/2010 |
| KR | 1020040107706 A | 12/2004 |
| KR | 1020050041612 A | 5/2005 |

\* cited by examiner

*Primary Examiner* — An Luu

(74) *Attorney, Agent, or Firm* — William Park & Associates Ltd.

(57) ABSTRACT

An internal clock frequency control circuit of a semiconductor memory apparatus includes a mode register set configured to receive a mode register set control signal and output a mode register set signal; a delay unit configured to generate an enable signal when a predetermined cycle has elapsed after the mode register set signal was activated; a division command decoder configured to receive and decode a synchronization command to generate a division start signal when the enable signal is activated; and a division selection unit configured to receive an input clock having a first frequency and output a selection clock having a second frequency, wherein a value of the second frequency is substantially the same as the first frequency or lower than the first frequency depending on a level of the division start signal.

17 Claims, 3 Drawing Sheets

US 8,237,486 B2

CLOCK CONTROL CIRCUIT AND SEMICONDUCTOR MEMORY APPARATUS USING THE SAME

CROSS-REFERENCES TO RELATED APPLICATION

The present application claims priority under 35 U.S.C. §119(a) to Korean Application No. 10-2010-0114410, filed on Nov. 17, 2010, in the Korean Intellectual Property Office, which is incorporated herein by reference in its entirety as if set forth in full.

BACKGROUND

1. Technical Field

The present invention relates to a semiconductor integrated circuit, and more particularly, to a clock cycle control circuit and a semiconductor memory apparatus including thereof.

2. Related Art

A semiconductor apparatus such as a semiconductor memory apparatus typically operates in synchronization with an external clock provided from outside. The frequency of the external clock should be increased for higher speed operations of the semiconductor memory apparatus. The semiconductor apparatus is thus designed to operate in synchronization with a clock having a high frequency.

Fundamentally, all external signals such as data, commands and addresses received by a semiconductor memory apparatus should be in synchronization with an external clock. The set up and hold margins of the data, commands and addresses, which are inputted in synchronization with the external clock may be reduced as the frequency of the clock increases. It is necessary to secure the set up and hold margins of such external signals for accurate operations of the semiconductor memory apparatus.

SUMMARY

Accordingly, there is a need for an internal clock frequency control circuit and a semiconductor apparatus using the same, which can increase the set up and hold margins of a command and an address inputted from outside of the semiconductor apparatus. It should be understood, however, that some aspects of the invention may not necessarily obviate the problem.

In the following description, certain aspects and embodiments will become evident. It should be understood that these aspects and embodiments are merely exemplary, and the invention, in its broadest sense, could be practiced without having one or more features of these aspects and embodiments.

In one exemplary embodiment of the present invention, a clock control circuit of a semiconductor apparatus includes: a mode register set configured to receive a mode register set control signal and output a mode register set signal; a delay unit configured to generate an enable signal when a predetermined cycle has elapsed after the mode register set signal was activated; a division command decoder configured to receive and decode a synchronization command to generate a division start signal when the enable signal is activated; and a division selection unit configured to receive an input clock having a first frequency and output a selection clock having a second frequency, wherein a value of the second frequency is substantially the same as the first frequency or lower than the first frequency depending on a level of the division start signal.

In another exemplary embodiment of the present invention, a semiconductor apparatus includes: an internal clock frequency control circuit configured to output a clock having a frequency substantially equal to a frequency of an external clock or a clock having a frequency different from the frequency of the external clock as a selection clock based on a mode register set control signal and a synchronization signal; a data processing unit configured to receive and output external data inputted as internal data based on the clock having the frequency substantially equal to the frequency of the external clock; and a command address processing unit configured to receive and output an external command and an external address as an internal command and an internal address based on the selection clock.

BRIEF DESCRIPTION OF THE DRAWINGS

The accompanying drawings, which are incorporated in and constitute a part of this specification, explain various embodiments consistent with the invention and, together with the description, serve to explain the principles of the invention.

DETAILED DESCRIPTION

Figure 1:
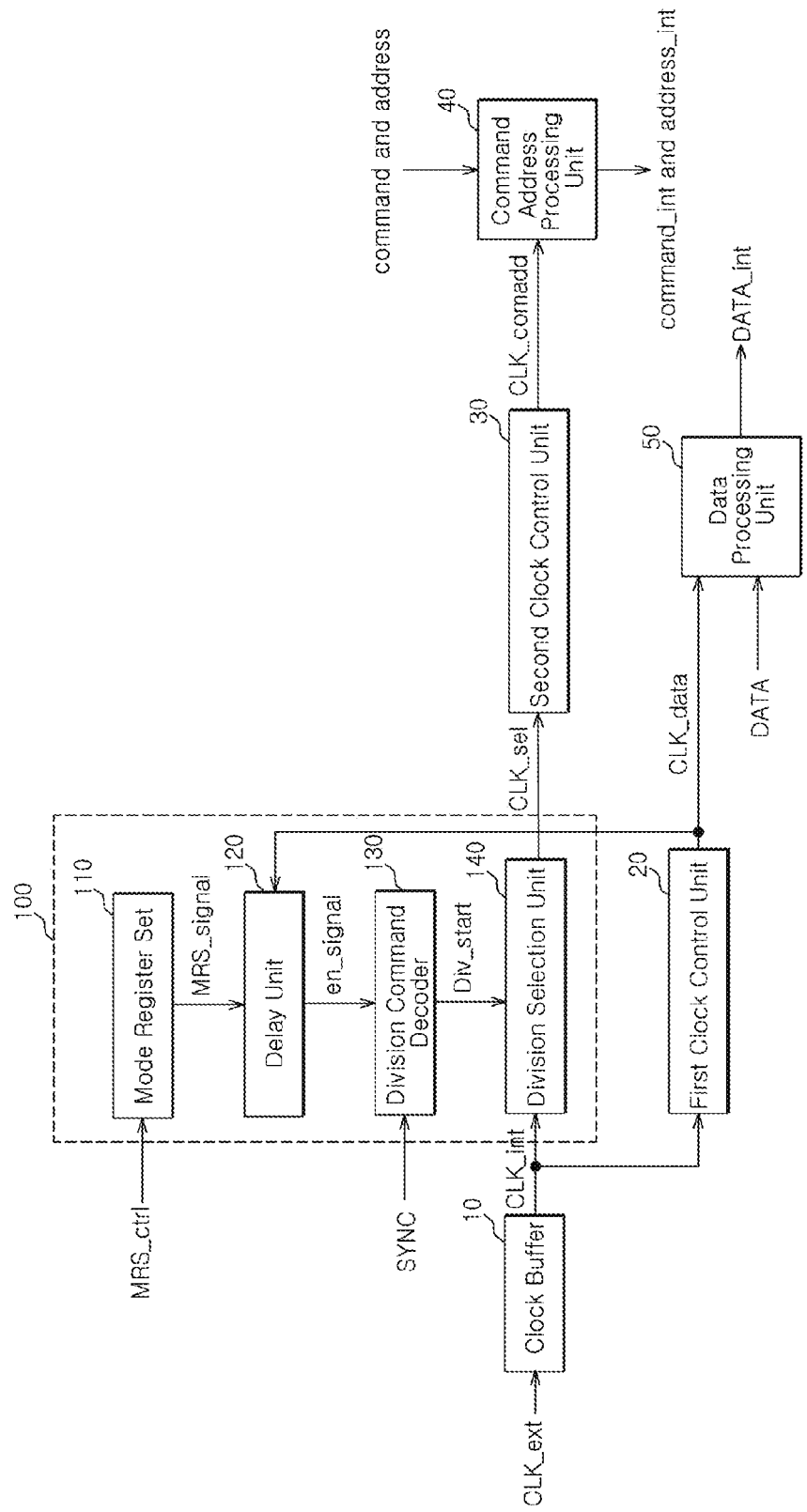
FIG. 1 is a configuration diagram schematically illustrating a semiconductor apparatus according to an embodiment of the invention.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 1 is a configuration diagram schematically illustrating a semiconductor apparatus according to an embodiment of the invention. Referring to FIG. 1, a semiconductor apparatus, e.g., a semiconductor memory apparatus, according to an embodiment of the invention includes a clock buffer 10, a first clock control unit 20, a second clock control unit 30, a command address processing unit 40, a data processing unit 50, and an internal clock frequency control circuit 100.

The clock buffer 10 is configured to buffer an external clock CLK_ext to generate an internal clock CLK_int.

The first clock control unit 20 is configured to receive the internal clock CLK_int to generate a data processing clock CLK_data. For example, the first clock control unit 20 may output the internal clock CLK_int as the data processing clock CLK_data or lock the data processing clock CLK_data to a specific level based on the operation of the semiconductor memory apparatus. In more detail, when the semiconductor memory apparatus performs an operation for receiving external data, the first clock control unit 20 outputs the internal clock CLK_int as the data processing clock CLK_data. However, when the semiconductor memory apparatus does not perform the operation for receiving the external data, the first clock control unit 20 locks the data processing clock CLK_data to the specific level.

The second clock control unit 30 is configured to receive a selection clock CLK_sel to generate a command address processing clock CLK_comadd. For example, the second clock control unit 30 outputs the selection clock CLK_sel as the command address processing clock CLK_comadd or locks the command address processing clock CLK_comadd to a specific level based on the operation of the semiconductor memory apparatus. In more detail, when the semiconductor memory apparatus performs an operation for receiving a command or an address from outside, the second clock control unit 30 outputs the selection clock CLK_sel as the command address processing clock CLK_comadd. However, when the semiconductor memory apparatus does not perform an operation for receiving a command or an address from outside, the second clock control unit 30 locks the command address processing clock CLK_comadd to the specific level.

The command address processing unit 40 is configured to output an external command and an external address inputted from outside as an internal command command_int and an internal address address_int based on the command address processing clock CLK_comadd.

The data processing unit 50 is configured to output external data DATA inputted from outside as internal data DATA_int based on the data processing clock CLK_data.

The internal clock frequency control circuit 100 is configured to output a clock having a frequency substantially equal to that of the external clock CLK_ext or a clock having a frequency different from that of the external clock CLK_ext as the selection clock CLK_sel based on a mode register set control signal MRS_ctrl and a synchronization signal SYNC.

The internal clock frequency control circuit 100 includes a mode register set 110, a delay unit 120, a division command decoder 130, and a division selection unit 140.

The mode register set 110 is configured to receive the mode register set control signal MRS_ctrl and generate a mode register set signal MRS_signal. For example, based on the mode register set control signal MRS_ctrl, the mode register set 110 decides the pulse width of the external command and the external address that the semiconductor memory apparatus receives, e.g., whether the pulse width of the external command and the external address corresponds to a half-cycle or a predetermined cycle (for example, one cycle) of the external clock CLK_ext, and activates the mode register set signal MRS_signal accordingly.

The delay unit 120 is configured to activate an enable signal en_signal when a predetermined number of cycles (for example, four cycles) of the data processing clock CLK_data has elapsed after the mode register set signal MRS_signal was activated. For example, after the predetermined number of cycles of the data processing clock CLK_data, the delay unit 120 outputs the mode register set signal MRS_signal as the enable signal en_signal.

Figure 2:
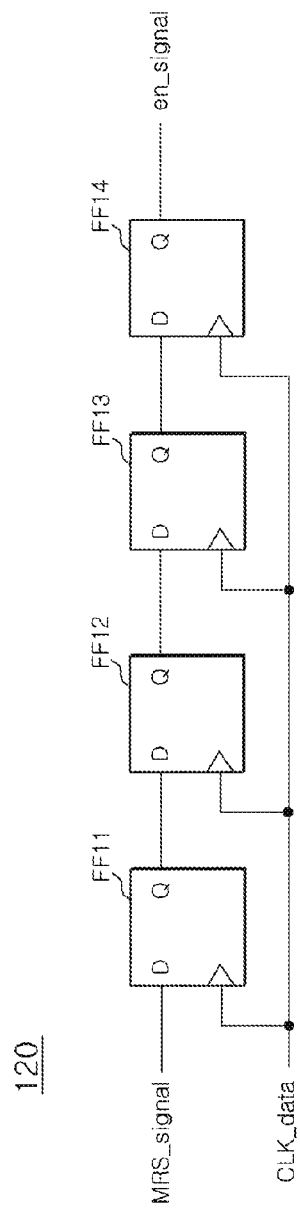
FIG. 2 is a configuration diagram schematically illustrating the delay unit illustrated in FIG. 1.

FIG. 2 is a configuration diagram schematically illustrating the delay unit illustrated in FIG. 1. Referring to FIG. 2, the delay unit 120 includes first to fourth flip-flops FF11 to FF14 which are coupled in cascade. Each of the first to fourth flip-flops FF11 to FF14 is configured to receive the data processing clock CLK_data. Among the first to fourth flip-flops FF11 to FF14, the foremost flip-flop, that is, the first flip-flop FF11 is configured to receive the mode register set signal MRS_signal, and the last flip-flop, that is, the fourth flip-flop FF14 is configured to output the enable signal en_signal. Since the four flip-flops FF11 to FF14 coupled in cascade shift the mode register set signal MRS_signal based on the data processing clock CLK_data, the mode register set signal MRS_signal is outputted as the enable signal en_signal after four cycles of the data processing clock CLK_data.

The division command decoder 130 is configured to decode a synchronization command SYNC to generate a division start signal DIV_start when the enable signal en_signal is activated. For example, when the enable signal en_signal is activated, the division command decoder 130 is activated to decode the synchronization command SYNC. If a decoded output of the synchronization command SYNC indicates a command that instructs division of the internal clock CLK_int, the division command decoder 130 activates the division start signal DIV_start. The synchronization command SYNC includes a chip select signal CS, a column address strobe (CAS) signal, a row column address strobe (RAS) signal, and a write enable (WE) signal, which are outputted from a controller located outside the semiconductor memory apparatus. The semiconductor memory apparatus recognizes a certain combination of the external signals as the synchronization command SYNC. For example, a low level chip select signal CS, a high level CAS signal, a high level RAS signal and a high level WE signal combined is recognized by the semiconductor memory apparatus as the synchronization command SYNC.

The division selection unit 140 is configured to divide the internal clock CLK_int to output a divided clock as the selection clock CLK_sel or output the internal clock CLK_int as the selection clock CLK_sel based on the division start signal DIV_start.

Figure 3:
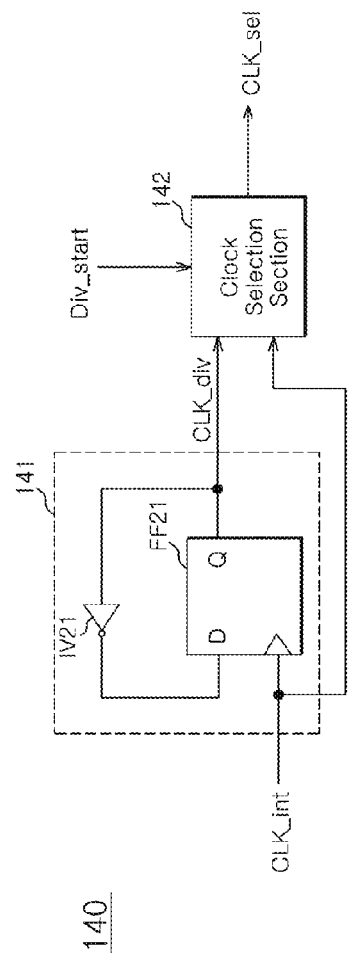
FIG. 3 is a configuration diagram schematically illustrating the division selection unit illustrated in FIG. 1.

FIG. 3 is a configuration diagram schematically illustrating the division selection unit illustrated in FIG. 1. Referring to FIG. 3, the division selection unit 140 includes a clock division section 141 and a clock selection section 142.

The clock division section 141 is configured to divide (for example, 2-division) the internal clock CLK_int and generate the divided clock CLK_div.

The clock division section 141 includes a fifth flip-flop FF21 and an inverter IV21. The fifth flip-flop FF21 outputs a signal, which is inputted to an input terminal thereof, to an output terminal thereof based on the internal clock CLK_int. The inverter IV21 receives and inverts a signal (that is, an output signal) from the output terminal of the fifth flip-flop FF21, and outputs an inverted signal to the input terminal of the fifth flip-flop FF21 as an input signal. The output signal of the fifth flip-flop FF21 is the divided clock CLK_div.

The clock selection section 142 is configured to output the internal clock CLK_int or the divided clock CLK_div as the selection clock CLK_sel based on the division start signal DIV_start. For example, the clock selection section 142 outputs the divided clock CLK_div as the selection clock CLK_sel when the division start signal DIV_start is activated, and outputs the internal clock CLK_int as the selection clock CLK_sel when the division start signal DIV_start is deactivated.

The operation of the semiconductor memory apparatus configured as above according to the embodiment of the invention will be described with reference to FIGS. 1 to 3 below.

The mode register set 110 is a general circuit used in order to store information regarding the operation of the semiconductor memory apparatus. The mode register set 110 stores information regarding whether the semiconductor memory apparatus receives an external command and an external address which have a pulse width corresponding to a half cycle of an external clock CLK_ext, or the external command and the external address which have a pulse width corresponding to one cycle of the external clock CLK_ext.

When the mode register set control signal MRS_ctrl is activated and inputted to the mode register set 110, the mode register set 110 activates the mode register set signal MRS_signal.

After four cycles of the data processing clock CLK_data, which has a frequency substantially equal to that of the internal clock CLK_int, the delay unit 120 outputs the activated mode register set signal MRS_signal as the enable signal en_signal.

When the enable signal en_signal is activated, the division command decoder 130 is activated to decode the synchronization command SYNC. At this time, if the synchronization command SYNC is a command that instructs division of the internal clock CLK_int, the division command decoder 130 activates the division start signal DIV_start.

The division selection unit 140 divides the internal clock CLK_int to generate the divided clock CLK_div, outputs the divided clock CLK_div as the selection clock CLK_sel when the division start signal DIV_start is activated, and outputs the internal clock CLK_int as the selection clock CLK_sel when the division start signal DIV_start is deactivated.

The internal clock CLK_int is inputted to the first clock control unit 20 and is then outputted to the data processing unit 50 as the data processing clock CLK_data.

The data processing unit 50 receives the external data DATA inputted from outside to generate the internal data DATA_int based on the data processing clock CLK_data.

The selection clock CLK_sel is inputted to the second clock control unit 30 and is then outputted to the command address processing unit 40 as the command address processing clock CLK_comadd.

The command address processing unit 40 outputs the external command and the external address as the internal command command_int and the internal address address_int based on the command address processing clock CLK_comadd.

According to the invention, the internal clock CLK_int is divided based on the mode register set control signal MRS_ctrl and the synchronization command SYNC. One of the divided clock CLK_div and the internal clock CLK_int is outputted as the selection clock CLK_sel, and the output timing of the selection clock CLK_sel is determined. The selection clock CLK_sel is used as the command address processing clock CLK_comadd.

According to the invention, the external command and the external address can be received based on the command address processing clock CLK_comadd, which has a frequency substantially equal to that of the external clock CLK_ext, and outputted as the internal command command_int and the internal address address_int. Furthermore, according to the invention, the external command and the external address can be received based on a clock (the command address processing clock CLK_comadd generated by a divided clock CLK_div obtained by dividing the external clock CLK_ext) having a frequency lower than that of the external clock CLK_ext, and outputted as the internal command command_int and the internal address address_int.

Meanwhile, according to the invention, the external data DATA can be received based on the data processing clock CLK_data, which has a frequency substantially equal to that of the external clock CLK_ext, and outputted as the internal data DATA_int.

Consequently, according to the invention, in the case of receiving external data, a clock having a frequency substantially equal to that of an external clock may be used. In the case of receiving an external command and an external address, a clock having a frequency substantially equal to that of an external clock or a clock having a frequency lower than that of the external clock may be used.

A general semiconductor memory apparatus receives external data, an external command and an external address, which are inputted from outside, at the rising timing of an external clock and outputs the external data, the external command and the external address as internal signals at the falling timing of the external clock. The sizes of the external data, the external command and the external address inputted to the general semiconductor memory apparatus are substantially equal to a half cycle of the external clock. As the frequency of the external clock is increased, the sizes of the external data, the external command and the external address are reduced. Therefore, in the general semiconductor memory apparatus, as the frequency of the external clock is increased, the set up and hold margins of the external data, the external command and the external address are reduced.

Figure 4A:
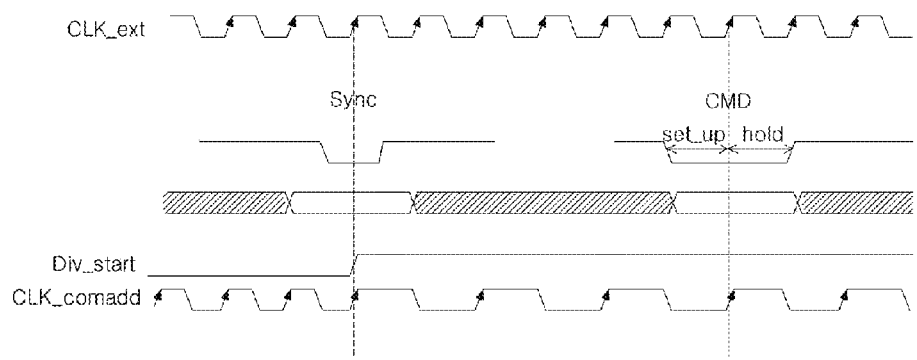
FIGS. 4A and 4B are timing diagrams of the semiconductor memory apparatus illustrated in FIG. 1 according to an embodiment of the invention.
Figure 4B:
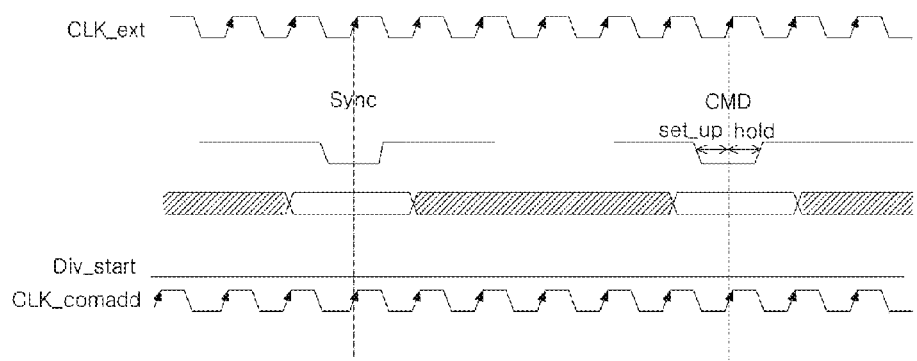

FIGS. 4A and 4B are timing diagrams of the semiconductor memory apparatus illustrated in FIG. 1 according to an embodiment of the invention. According to the invention, external data is received based on a clock having a frequency substantially equal to that of an external clock, and an external command and an external address are received based on a clock having a frequency substantially equal to that of the external clock or a clock having a frequency lower than that of the external clock. Consequently, according to the invention, external data corresponding to a half cycle of the external clock can be received, and an external command and an external address larger than the half cycle of the external clock can be received according to users using the semiconductor memory apparatus or preset environments. According to the invention, it may be possible to substantially maintain the set up and hold margins of an external command and an external address similarly to the conventional art, that is, as illustrated in FIG. 4B, and to increase the set up and hold margins of the external command and the external address as illustrated in FIG. 4A.

As a result, according to the invention, it is possible to increase the set up and hold margins of an external command and an external address while substantially maintaining a data input speed similarly to the conventional art.

While certain embodiments have been described above, it will be understood to those skilled in the art that the embodiments described are by way of example only. Accordingly, the internal clock frequency control circuit and the semiconductor memory apparatus using the same described herein should not be limited based on the described embodiments. Rather, the internal clock frequency control circuit and the semiconductor memory apparatus using the same described herein should only be limited in light of the claims that follow when taken in conjunction with the above description and accompanying drawings.

What is claimed is:

1. A clock control circuit of a semiconductor apparatus comprising:
   a mode register set configured to receive a mode register set control signal and output a mode register set signal;
   a delay unit configured to generate an enable signal when a predetermined cycle has elapsed after the mode register set signal was activated;
   a division command decoder configured to receive and decode a synchronization command to generate a division start signal when the enable signal is activated; and
   a division selection unit configured to receive an input clock having a first frequency and output a selection clock having a second frequency, wherein a value of the second frequency is substantially the same as the first frequency or lower than the first frequency depending on a level of the division start signal.

2. The clock control circuit according to claim 1, wherein the mode register set is configured to, based on the mode register set control signal, decide a pulse width of the external command and the external address that the semiconductor memory apparatus receives.

3. The clock control circuit according to claim 1, wherein the delay unit is configured to output the mode register set signal as the enable signal when a predetermined cycle of a data processing clock has elapsed after the mode register set signal was activated.

4. The clock control circuit according to claim 3,
wherein the delay unit includes a plurality of flip-flops coupled in cascade, and
wherein each one of the plurality of flip-flops receives the data processing clock, a foremost flip-flop of the plurality of flip-flops receives the mode register set signal, and a last flip-flop of the flip-flops outputs the enable signal.

5. The clock control circuit according to claim 1, wherein the division command decoder is configured to be activated when the enable signal is activated, decode the synchronization command, and activate the division start signal if a decoded output of the synchronization command indicates a command that instructs division of the input clock.

6. The clock control circuit according to claim 1, further comprising:
a clock buffer configured to output the input clock by buffering an external clock; and
a clock control unit configured to receive the input clock and generate the data processing clock.

7. The clock control circuit according to claim 6, wherein the division selection unit comprises:
a clock division section configured to divide the input clock and generate a divided clock; and
a clock selection section configured to output the input clock or the divided clock as the selection clock based on the division start signal.

8. A semiconductor apparatus comprising:
an internal clock frequency control circuit configured to output a clock having a frequency substantially equal to a frequency of an external clock or a clock having a frequency different from the frequency of the external clock as a selection clock based on a mode register set control signal and a synchronization signal;
is a data processing unit configured to receive and output external data inputted as internal data based on the clock having the frequency substantially equal to the frequency of the external clock; and
a command address processing unit configured to receive and output an external command and an external address as an internal command and an internal address based on the selection clock.

9. The semiconductor apparatus according to claim 8, wherein the internal clock frequency control circuit comprises:
a clock buffer configured to generate an internal clock by buffering the external clock;
a first clock control unit configured to receive the internal clock and generate a data processing clock inputted to the data processing unit; and
a second clock control unit configured to receive the selection clock and generate a command address processing clock inputted to the command address processing unit.

10. The semiconductor apparatus according to claim 9, wherein the data processing unit is configured to output the external data to the internal data based on the data processing clock.

11. The semiconductor apparatus according to claim 9, wherein the command address processing unit is configured to output the external command and the external address as the internal command and the internal address based on the clock for command address processing.

12. The semiconductor apparatus according to claim 9, wherein the internal clock frequency control circuit comprises:
a mode register set configured to receive the mode register set control signal and output a mode register set signal;
a delay unit configured to activate an enable signal when a predetermined cycle has elapsed after the mode register set signal was activated;
a division command decoder configured to decode the synchronization command and generate a division start signal when the enable signal is activated; and
a division selection unit configured to output a clock obtained by dividing the internal clock as the selection clock or output the internal clock as the selection clock based on the division start signal.

13. The semiconductor apparatus according to claim 12, wherein the mode register set is configured to determine whether the semiconductor apparatus receives the external command and the external address which have a pulse width corresponding to a half cycle of the external clock, or the external command and the external address which have a pulse width corresponding to one cycle of the external clock, based on the mode register set control signal.

14. The semiconductor apparatus according to claim 12, wherein the delay unit is configured to output the mode register set signal as the enable signal after a predetermined period of time of the data processing clock, which has a frequency substantially equal to the frequency of the external clock.

15. The semiconductor apparatus according to claim 14,
wherein the delay unit includes a plurality of flip-flops coupled in cascade, and
wherein each flip-flop receives the data processing clock, a foremost flip-flop of the plurality of flip-flops receives the mode register set signal, and a last flip-flop of the flip-flops outputs the enable signal.

16. The semiconductor apparatus according to claim 12, wherein the division command decoder is configured to be activated when the enable signal is activated, decode the synchronization command, and activate the division start signal if a decoded output of the synchronization command indicates a command that instructs division of the internal clock.

17. The semiconductor apparatus according to claim 12, wherein the division selection unit comprises:
a clock division section configured to divide the internal clock and generate a divided clock; and
a clock selection section configured to output the internal clock or the divided clock as the selection clock based on the division start signal.

* * * * *